United States Patent
Rao et al.

(10) Patent No.: US 10,600,664 B2
(45) Date of Patent: Mar. 24, 2020

(54) FLUORESCENCE BASED THERMOMETRY FOR PACKAGING APPLICATIONS

(71) Applicant: APPLIED MATERIALS, INC., Santa Clara, CA (US)

(72) Inventors: Preetham Rao, Singapore (SG); Ananthkrishna Jupudi, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 226 days.

(21) Appl. No.: 15/585,842

(22) Filed: May 3, 2017

(65) Prior Publication Data

US 2018/0323092 A1   Nov. 8, 2018

(51) Int. Cl.
*H01L 21/67* (2006.01)
*G01K 11/32* (2006.01)
(Continued)

(52) U.S. Cl.
CPC ........ *H01L 21/67248* (2013.01); *G01K 11/20* (2013.01); *G01K 11/32* (2013.01);
(Continued)

(58) Field of Classification Search
CPC ........ G01K 11/32; G01K 11/20; G01K 11/12; G01K 13/02; G01K 11/3213
See application file for complete search history.

(56) References Cited

U.S. PATENT DOCUMENTS 3,567,932 A * 3/1971 Alburger ............... G01N 21/91
250/302
4,466,746 A * 8/1984 Hancock ............... G01N 25/72
324/750.06
(Continued)

FOREIGN PATENT DOCUMENTS

CN   103579459 A   *   2/2014
CN   204481337 U   *   7/2015
(Continued)

OTHER PUBLICATIONS

"Investigation of measuring hazardous substances in printed circuit boards using the micro-focus X-ray fluorescence screening", Fu Ming-Lei et al. (7 pages).
(Continued)

*Primary Examiner* — Gail Kaplan Verbitsky
(74) *Attorney, Agent, or Firm* — Moser Taboada; Alan Taboada

(57) ABSTRACT

Methods and apparatus for measuring the temperature of epoxy resin in an electronics package are provided herein. In some embodiments, apparatus for encapsulating an electronics package includes: a process chamber having a chamber body enclosing a processing volume; a substrate support having a support surface for receiving and supporting a substrate for forming an electronics package; and a temperature sensor to measure a temperature of an epoxy resin in an electronics package. The temperature sensor includes: an input apparatus including at least a light source disposed outside the chamber body to provide an excitation light energy to a portion of the epoxy resin; and an output apparatus including at least a signal analyzer disposed outside the chamber body to detect fluorescent light energy emitted by the portion of the epoxy resin and determine a temperature of the epoxy resin based on the excitation light energy and the fluorescent light energy.

16 Claims, 5 Drawing Sheets

(51) Int. Cl.
*H01L 21/687* (2006.01)
*H01L 21/66* (2006.01)
*G01K 11/20* (2006.01)
*H01L 23/00* (2006.01)
*H01L 23/31* (2006.01)

(52) U.S. Cl.
CPC .. *H01L 21/67126* (2013.01); *H01L 21/67253* (2013.01); *H01L 21/68771* (2013.01); *H01L 22/10* (2013.01); *H01L 23/3128* (2013.01); *H01L 24/20* (2013.01); *H01L 24/96* (2013.01)

(56) References Cited

U.S. PATENT DOCUMENTS

| | | | | |
|---|---|---|---|---|
| 5,653,539 | A * | 8/1997 | Rosengaus | G01K 11/20 250/361 C |
| 5,705,821 | A * | 1/1998 | Barton | G01B 11/20 250/458.1 |
| 5,755,877 | A * | 5/1998 | Kamakura | C30B 29/40 117/202 |
| 6,543,935 | B2 | 4/2003 | Balla | G01K 11/00 374/120 |
| 8,425,858 | B2 * | 4/2013 | LeBoeuf | G01N 21/6428 117/952 |
| 2003/0128737 | A1 * | 7/2003 | McGrath | G01K 11/20 374/161 |
| 2003/0206573 | A1 * | 11/2003 | Gotthold | G01J 5/0003 374/132 |
| 2004/0035529 | A1 * | 2/2004 | Grimbergen | H01J 37/32935 156/345.24 |
| 2009/0168837 | A1 * | 7/2009 | Heisig | C23C 14/541 374/121 |
| 2010/0206482 | A1 * | 8/2010 | Matsudo | G01J 5/0003 156/345.27 |
| 2012/0243573 | A1 * | 9/2012 | Matsudo | G01K 5/48 374/161 |
| 2013/0034122 | A1 * | 2/2013 | Lewis | G01K 11/3213 374/161 |
| 2014/0099798 | A1 * | 4/2014 | Tsuji | H01L 21/268 438/795 |
| 2016/0118565 | A1 * | 4/2016 | Lin | H01L 33/641 257/99 |

FOREIGN PATENT DOCUMENTS

| | | | |
|---|---|---|---|
| JP | 357168125 | A * | 10/1982 |
| JP | 2014053367 | A * | 3/2014 |
| KR | 2013123793 | A * | 11/2013 |

OTHER PUBLICATIONS

"A system for PCB automated inspection using fluorescent light", Y. Hara et al, IEEE Transactions on Pattern Analysis and Machine Intelligence (vol. 10, Issue: 1, Jan. 1988) (pp. 69-78).

"Inspection of PCBs by laser-induced fluorescence", Alex Alaluf et al, Circuit World, vol. 28, Issue 1 (pp. 1-9).

"Fluorescence temperature measurements: Methodology for applications to process monitoring" A. J Bur et al, Polymer Science and Engineering, May 2004. vol. 44, No. 5. (pp. 898-908).

"A fiber optic temperature sensor with an epoxy-glue membrane as a temperature indicator", S. Tao, A. Jayaprakash, Sensors and Actuators B 119 (2006) pp. 615-620.

"Fluorescence based temperature measurements and applications to real time polymer processing". A. J Bur et al, Polymer Science and Engineering, Aug. 2001, vol. 41, No. 8. (pp. 1380-1389).

"Room-Temperature Phosphorescence Studies of Epoxy Resin Cured by an Aromatic Diamine", Jian Chen Song et al, Macromolecules, 1995, vol. 28. (pp. 5581-5584).

Cure Monitoring for Composites and Adhesives, David Mulligan (pp. 1-123).

"Temperature dependence of fluorescence and phosphorescence from probe molecules in polymer substrates", K. J. Smit et al., European Polymer Journal, vol. 19, Issue 1, 1983 (pp. 49-53).

"Variation of Fluorescence With Temperature in Human Tissue", MS Thesis, Daniel Barton Masters, Vanderbilt University, Nashville, Tennessee, May 2010 (pp. 1-68).

"Dynamic Stokes shift in green fluorescent protein variants", Paul Abbyad et al, Proceedings Nat. Acad. Sci., Dec. 2007 vol. 104, No. 51, pp. 20189-20194.

"NIGHTSEA™ Fluorescence Viewing Systems", Product Catalogue, Electron Microscopy Sciences, Hatfield, PA, www.emsdiasum.com (pp. 1-12).

"Novel fluorescence method for cure monitoring of epoxy resins", F. W. Wang et al, Polymer, vol. 27, Issue 10, 1986 (pp. 1529-1532).

"Thermo-optical characterization of fluorescent rhodamine B based temperature-sensitive nanosensors using a CMOS MEMS microhotplate", V. M. Chauhan et al, Sensors and Actuators B: Chemical, vol. 192, Mar. 1, 2014, pp. 126-133.

Calibration of Laser Induced Fluorescence Thermometry Using 2'7' Dichlorofluorescein and Sulforhodamine B, PH 403 Senior Thesis, Jaryd Ulbricht, Oregon State University, 2012 (pp. 1-24).

* cited by examiner

FLUORESCENCE BASED THERMOMETRY FOR PACKAGING APPLICATIONS

FIELD

Embodiments of the present disclosure generally relate to electronics manufacturing.

BACKGROUND

Epoxy resin formulations are excellent electrical insulators and protect electrical components from short circuiting, dust and moisture. In the electronics industry, epoxy resins are the primary resin used in packaging electronics in the manufacture of printed circuit boards, integrated circuits, transistors, hybrid circuits, and the like.

Electronics packaging typically includes using an epoxy resin to encapsulate one or more polymer layers having dies and dielectric or metal circuit interconnectors. Current epoxy encapsulating methods include temperature-sensitive processes such as curing, pre-cleaning, and degassing necessary to remove moisture and improve the material properties of the package.

These temperature-sensitive processes are conventionally carried out at temperatures that may range from about 100° C. to about 200° C. The type of heat used depends on the requirements of the temperature-sensitive process and particular application of the electronics package. Typically, one or more heat sources provide resistive, convective, radiative, or microwave heating, as desired for the temperature-sensitive process or electronics package application. The temperature of the epoxy is typically measured, monitored and, controlled during each heating process in order to ensure high quality cleaning, moisture removal, and process uniformity. Throughput is normally enhanced by performing the temperature-sensitive processes on batches of multiple packages. Currently available temperature measuring techniques include contact thermometry and non-contact thermometry using infrared pyrometers. However, the inventors have discovered that the currently available temperature measuring techniques fail to accurately and reliably measure the temperature. The inventors have further discovered that the currently available temperature measuring techniques inadequately measure the temperature during the processing of a batch of multiple packages.

Therefore, the inventors have provided improved apparatus and methods for measuring, monitoring and controlling the temperature during packaging.

SUMMARY

Methods and apparatus for measuring the temperature of epoxy resin in an electronics package are provided herein. In some embodiments, apparatus for encapsulating an electronics package includes: a process chamber having a chamber body enclosing a processing volume; a substrate support having a support surface for receiving and supporting a substrate for forming an electronics package; and a temperature sensor to measure a temperature of an epoxy resin in an electronics package. The temperature sensor includes: an input apparatus including at least a light source disposed outside the chamber body to provide an excitation light energy to a portion of the epoxy resin; and an output apparatus including at least a signal analyzer disposed outside the chamber body to detect fluorescent light energy emitted by the portion of the epoxy resin and determine a temperature of the epoxy resin based on the excitation light energy and the fluorescent light energy.

In some embodiments, a substrate for forming an electronics package includes: a body having an upper surface area; an array of microcircuit dies disposed in the body and substantially covering the upper surface area; and an epoxy resin disposed between adjacent microcircuit dies and along the periphery of the body, away from the array of microcircuit dies.

In some embodiments, a method for measuring a temperature of an epoxy resin in an electronics package includes: (a) providing an excitation light beam to a portion of an epoxy resin encapsulating an electronics package; (b) receiving a fluorescent light beam emitted from the portion of the epoxy resin; (c) measuring an emission energy, a wavelength, and an intensity of the fluorescent light beam; and (d) determining a temperature of the epoxy resin based on the excitation light beam and emitted fluorescent light beams.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1A:
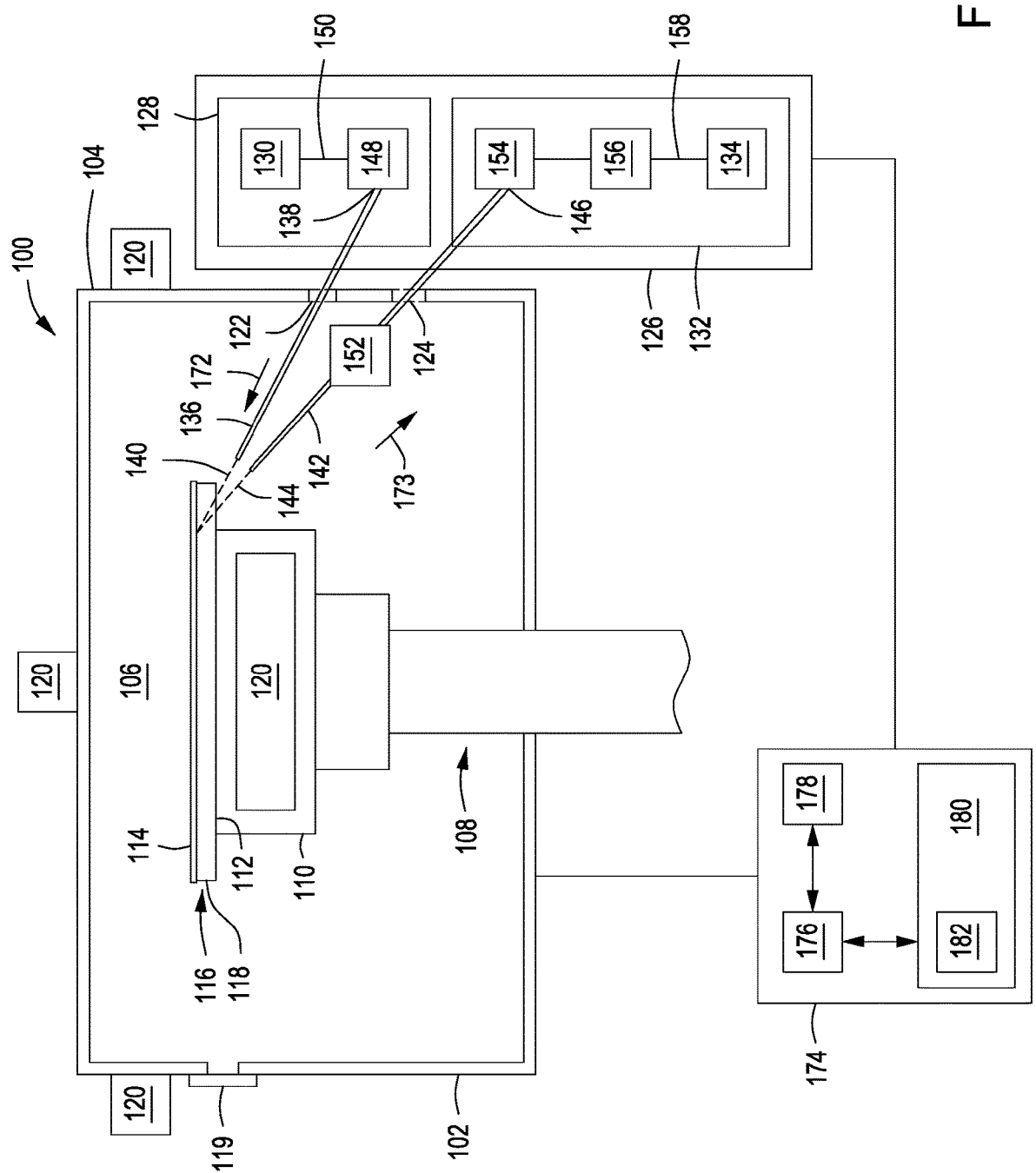
FIG. 1A depicts a schematic view of a process chamber including a temperature measuring apparatus in accordance with one or more embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide improved measurement and monitoring of the temperature of an epoxy resin used during encapsulation of an electronics package. When using an epoxy resin to encapsulate an electronics package, temperature-sensitive processes such as curing, pre-cleaning, and degassing are closely monitored and tightly controlled in order to prevent defects due to overheating or poor process results due to under-heating. The disclosed methods and apparatus advantageously facilitate accurate and fast (e.g., real-time) measurements of the temperature of an epoxy resin during one or more temperature sensitive processes used to encapsulate an electronics package. Accurate and fast thermometry improves process uniformity and more rapid corrective intervention when there is a drift in the process and epoxy resin temperature.

FIG. 1A is a schematic view of an exemplary apparatus 100 including a process chamber incorporating a temperature measuring apparatus in accordance with one or more embodiments of the present disclosure. As shown in FIG. 1A, the exemplary apparatus 100 includes a process chamber 102 having a chamber body 104 defined by sidewalls, a bottom portion, and a top portion. The chamber body 104 encloses a processing volume 106.

A pedestal 108 is disposed in the processing volume 106. The pedestal 108 includes a substrate support 110 having a support surface 112. The support surface 112 is configured to receive and support a substrate, for example, a substrate 114 having one or more electronics packages 116 formed or disposed on the substrate 114. Optionally, in some embodiments, the support surface 112 may be configured to support a substrate carrier 118. The substrate carrier 118 is permeable to light energy. In some embodiments, the substrate carrier 118 may comprise glass. For example, the glass of the substrate carrier 118 may be configured to be transparent to light energy in the absorbed and emitted radiation wavelength bands of fluorescence materials contained in the one or more electronics packages 116 (e.g. epoxy resin 206 and/or dopant 208, discussed below)

In some embodiments, the chamber body 104 may include an opening 119 (e.g., a slit valve opening) formed through one of the sidewalls at a height proximate the substrate support 110 to facilitate the ingress and egress of one or more substrates 114 into the processing volume 106, for example, onto and off the support surface 112. In some embodiments, the opening 119 may be retractably sealable, for example, to control the pressure and temperature conditions of the processing volume 106.

In some embodiments, the process chamber 102 may include a heat source 120 disposed about the chamber body 104 or in the processing volume 106. In the exemplary embodiment depicted in FIG. 1A, a heat source 120 is disposed in the pedestal 108. In some embodiments, the heat source 120 may be a resistive heater, a convective heater, a radiative heater, or a microwave heater, or a combination of two or more types of heaters. In some embodiments, the chamber body 104 may be configured to receive and radiate microwave, convective, or other similar kinds of heat energy from one or more heat sources 120 disposed outside the chamber body 104. In some embodiments, a resistive heat source disposed in the pedestal 108 may be used in combination with one or more radiative microwave or convective heating sources disposed about the chamber body 104, as illustrated in FIG. 1A. In some embodiments, a resistive heat source disposed in the pedestal 108 may be the only heat source provided, for example, if the provided one or more electronics packages 116 include uncovered fluorescence materials (e.g. epoxy resin 206 and/or dopant 208, discussed below).

A first window 122 and a second window 124 are formed in the chamber body 104. The first window 122 is provided for the ingress of light energy into the processing volume 106. The second window 124 is provided for the egress of light energy out of the processing volume 106. In some embodiments, one window is provided and light energy can enter and leave the processing volume 106 through the one window. In some embodiments, the first window 122 and the second window 124 are disposed in the same part of the chamber body 104. In the exemplary embodiment depicted in FIGS. 1A, both the first and second windows 122, 124 are disposed in a sidewall of the chamber body 104.

Either or both of the first and second windows, or a single window, may be provided in other suitable locations to facilitate light energy entering and leaving the processing volume in the manner as disclosed herein. In some embodiments, the first and second windows 122, 124 may be respectively disposed in oppositely facing sidewalls. In some embodiments, one of the first and second windows 122, 124 may be disposed in the bottom of the chamber body 104 and the other one of the first and second windows 122, 124 may be disposed in a sidewall of the chamber body 104. In some embodiments, both of the first and second windows 122, 124 may be disposed in the bottom of the chamber body 104.

A temperature sensor 126 is provided outside the process chamber. The temperature sensor 126 includes an input apparatus 128. The input apparatus 128 includes at least a light source 130 disposed outside the chamber body 104. The light source 130 is provided to deliver light to the processing volume 106, through the first window 122. The temperature sensor 126 further includes an output apparatus 132. The output apparatus 132 includes at least a signal analyzer 134 disposed outside the chamber body 104. The signal analyzer is provided to receive and analyze light signals from the processing volume 106, through the second window 124.

In some embodiments, for example as illustrated in FIGS. 1A, the input apparatus 128 includes a first optical conduit 136 disposed through the first window 122. The first optical conduit 136 provides an optical pathway to light energy from the light source 130 into the processing volume 106 (e.g., to the underside of the substrate 114 of the electronics package 116, when present). The first optical conduit 136 further includes a first receiving end 138 and a first delivery end 140 opposite the first receiving end 138. The first optical conduit 136 can be made of a fiber optic material.

The first optical conduit 136 is operatively coupled to the light source 130. The light source 130 is configured to provide light energy having a wavelength between about 360 nm and about 400 nm, for example, about 385 nm. In some embodiments, the light source 130 may be an ultraviolet (UV) light excimer laser.

The first receiving end 138 is positioned to receive light from the light source 130. The first delivery end 140 is positioned to deliver light energy to the processing volume 106 (e.g., to the underside of the substrate 114 of the electronics package 116, when present). As depicted in FIG. 1A, the first delivery end 140 is disposed inside the processing volume 106.

In some embodiments, for example as illustrated in FIG. 1A, the output apparatus 132 includes a second optical conduit 142 disposed through the second window 124. The second optical conduit 142 provides an optical pathway to light signals leaving the processing volume 106 (e.g., from the underside of the substrate 114 of the electronics package 116, when present) for delivery to the signal analyzer 134. The second optical conduit 142 includes a second receiving end 144 and a second delivery end 146 opposite the second receiving end 144. The second optical conduit 142 is made of a fiber optic material.

The second receiving end 144 is positioned to receive light from the processing volume 106 (e.g., from the underside of the substrate 114 of the electronics package 116, when present). The second delivery end 146 is positioned to deliver light signals to the signal analyzer 134.

The input apparatus further includes a first optics arrangement 148 disposed between the light source 130 and the first window 122 configured to collect, guide, and focus light provided by the light source 130 towards the first window 122. In some embodiments, the first optics arrangement 148 includes light prisms and lenses. A first light carrier 150 couples the light source 130 to the first optics arrangement 148. In some embodiments, the first light carrier 150 may be made of a fiber optic material. For example, the first light carrier 150 may be a fiber optic cable or a flexible fiber optic light pipe. In some embodiments, for example, as depicted in FIG. 1A, the first optics arrangement 148 directs the light from the light source 130 to the first receiving end 138 of the first optical conduit 136.

The output apparatus further includes a second optics arrangement 152 disposed proximate the second window 124 configured to collect light emitted from an irradiated area inside the processing volume 106 (e.g., the underside of the substrate 114 of the electronics package 116, when present). In some embodiments, for example, as depicted in FIG. 1A, the second optics arrangement is disposed proximate the second receiving end 144 of the second optical conduit 142. In some embodiments, the second optics arrangement 152 include light prisms and lenses.

The output apparatus further includes a filtering element 154. The filtering element 154 is coupled to the second delivery end 146 and disposed between the second delivery end 146 and a third optics arrangement 156. The filtering element 154 is provided to block the reflectance component and allow the fluorescence component of the light emitted from an irradiated area inside the processing volume 106. In some embodiments, the filtering element 154 may be made of quartz. In some embodiments, the quartz filter may be doped with chemical compositions to allow the filter to block light waves based on a predetermined frequency.

The third optics arrangement 156 is disposed between the filtering element 154 and the signal analyzer 134 and is configured to collect and focus fluorescence light into the signal analyzer 134. In some embodiments, third optics arrangement 156 includes light prisms and lenses. A second light carrier 158 couples the third optics arrangement 156 to the signal analyzer 134. In some embodiments the second light carrier 158 may be made of a fiber optic material. For example, the second light carrier 158 may be a fiber optic cable or a flexible fiber optic light pipe.

The signal analyzer 134 comprises a fluorescence spectrophotometer (fluoro-spectrometer). The fluoro-spectrometer is configured to read and perform a spectral analysis on the fluorescence light signals.

Figure 1B:
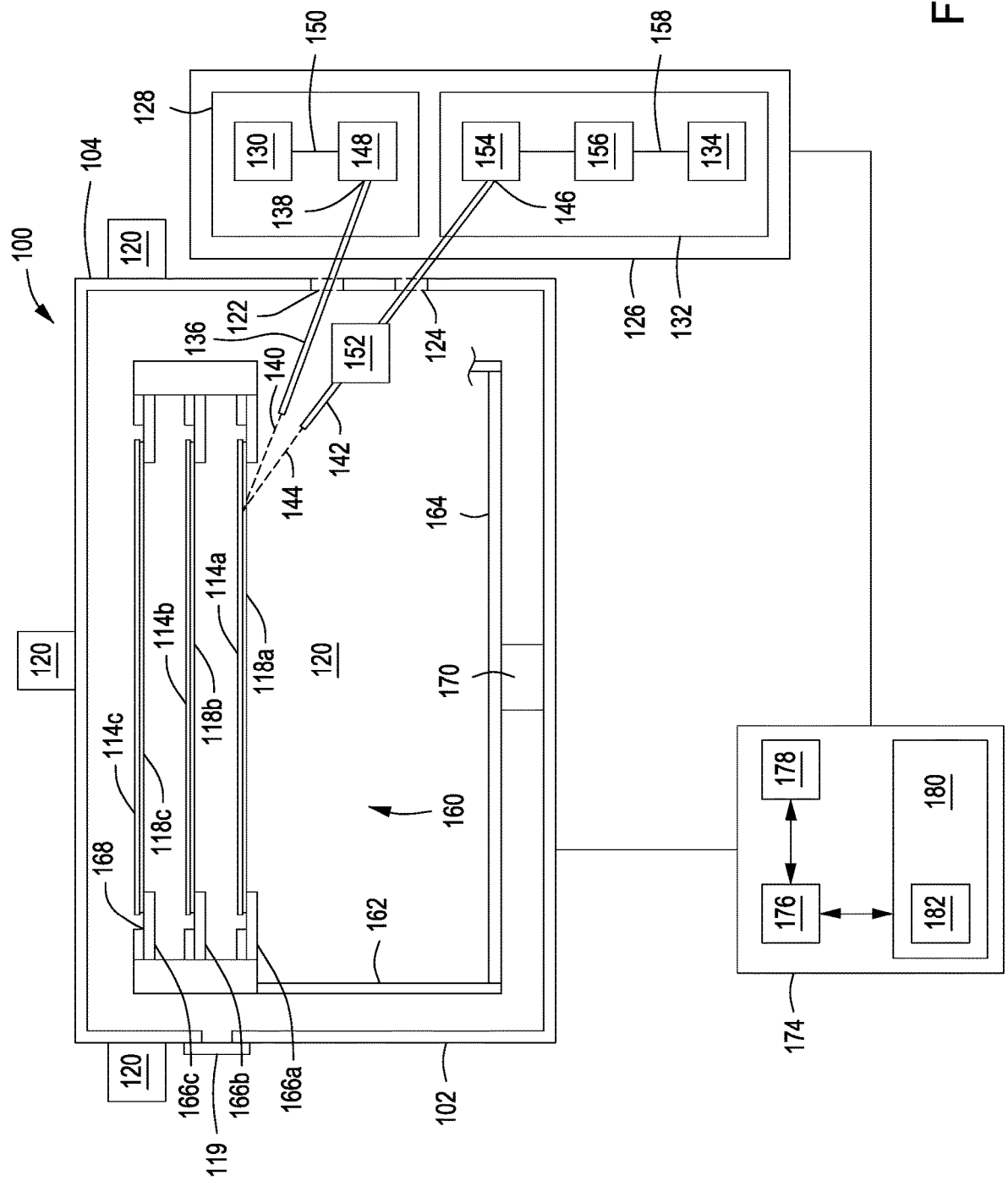
FIG. 1B depicts a schematic view of another process chamber including a temperature measuring apparatus in accordance with one or more embodiments of the present disclosure.

In some embodiments, as depicted in FIG. 1B, the process chamber 102 may include a multiple substrate holder 160 configured to support multiple substrates in a vertically spaced apart configuration (e.g., substrates 114a, 114b, and 114c of electronics packages 116a, 116b, and 116c). As depicted in FIG. 1B the multiple substrate holder 160 may be used without the substrate support 110 or any part of the pedestal 108. Although FIG. 1B shows one exemplary configuration, teachings of the present disclosure may be adapted for multiple substrate holders having other configurations as well, for example, in combination with the pedestal 108 and/or the substrate support 110.

The multiple substrate holder 160 includes one or more vertical supports 162. In some embodiments, the vertical supports 162 may be supported by the bottom of the chamber body 104, for example via one more coupling elements such as fastening screws or the like. In some embodiments, for example, as depicted in FIG. 1B, the multiple substrate holder 160 optionally includes a bottom member 164 coupled to the one or more vertical supports 162 and for supporting the one or more vertical supports 164 (one vertical support 162 is shown in FIG. 1B). The vertical supports 162 further include a plurality of peripheral members (e.g., peripheral members 166a, 166b, and 166c) extending radially inward from the vertical supports 162. In some embodiments, for example, as shown in FIG. 1B, each peripheral member may include stepped portion 168 for receiving and supporting the substrate 114.

In some embodiments, for example as depicted in FIG. 1B, the plurality of peripheral members (e.g., peripheral members 166a, 166b, 166c) may be configured to support respective substrates (e.g., substrates 114a, 114b, 114c) supported and transported by substrate carriers (e.g., substrate carriers 118a, 118b, 118c). In some embodiments, the peripheral members (e.g., peripheral members 166a, 166b, 166c) are configured to directly hold and support the respective substrates (e.g., substrates 114a, 114b, 114c).

The multiple substrate holder 160 further includes a lift assembly 170. The lift assembly 170 may include one or more of a motor, an actuator, or the like, to control the vertical position of the peripheral members (e.g., peripheral members 166a, 166b, 166c). The vertical position of the peripheral members (e.g., peripheral members 166a, 166b, 166c) is controlled for placing and removing each substrate carrier (e.g., substrate carriers 118a, 118b, 118c) and/or substrate (e.g., substrates 114a, 114b, 114c) through the opening 119 and onto or off of the substrate support.

A plurality of temperature sensors 126 (e.g., as described with respect to FIG. 1A) may be provided, each temperature sensor corresponding to one of multiple locations to be in the processing volume 106 (e.g., the underside of each substrate 114a, 114b, and 114c when provided and disposed on peripheral members 166a, 166b, and 166c as depicted in FIG. 1B). Although, FIG. 1B depicts one temperature sensor 126, when duplicate temperature sensors are provided, a corresponding plurality of first and second optical conduits 136, 142 are disposed through a plurality of respective pairs of first and second windows 122, 124. The respective pairs of first and second windows 122, 124 are formed in locations on the chamber body 104 (e.g., through the sidewalls and/or bottom of the chamber body 104) to allow delivery of light to and receipt of light from each location (e.g., the underside of each substrate 114a, 114b, and 114c when provided and disposed on peripheral members 166a, 166b, and 166c).

In some embodiments, a single light source 130 may be used to supply light to the respective locations. For example, in some embodiments, the first optics arrangement may include an optical splitter for splitting the excitation light beam into multiple excitation light beams that are each directed to each first window 122. In some embodiments, the optical splitter may include partially coated reflectors to split the excitation light beam and light prisms to direct the excitation light to the various substrate locations after splitting. In some embodiments, a single signal analyzer 134 may be used to read and perform a spectral analysis of the fluorescence light from the multiple locations (e.g., from the underside of each substrate 114a, 114b, and 114c when provided and disposed on peripheral members 166a, 166b, and 166c).

Figure 2:
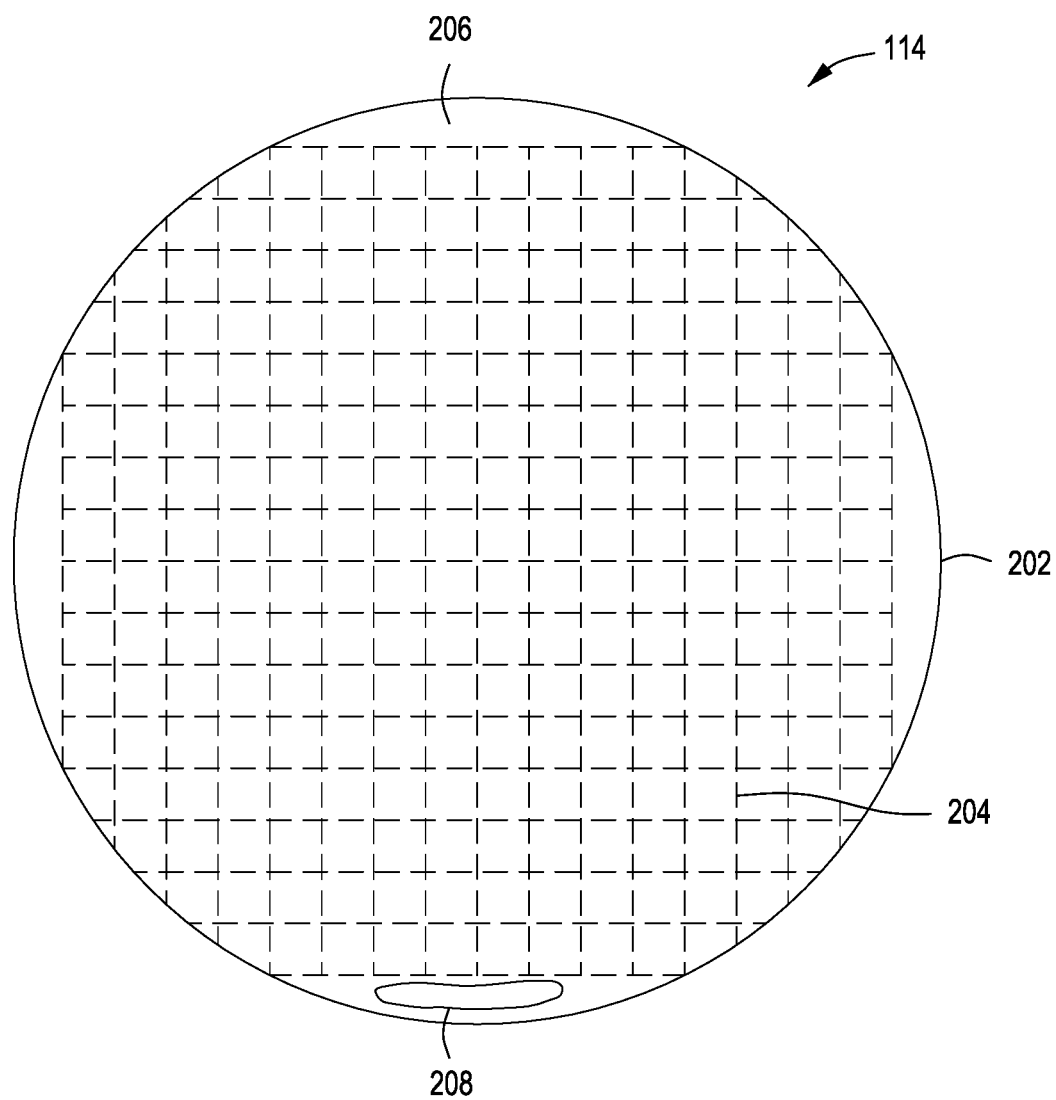
FIG. 2 is a schematic top view of an exemplary substrate for forming an electronics package in accordance with one or more embodiments of the present disclosure.

FIG. 2 depicts an exemplary substrate 114 of the electronics package 116. For example, in some embodiments, the substrate 114 may be a silicon wafer. In some embodiments, the substrate 114 may comprise one or more polymers or metals suitable for electronics packaging applications. As shown in FIG. 2, the substrate 114 is disposed the substrate carrier 118 discussed above and shown in FIGS. 1A and 1B. The substrate 114 has a body 202 having an upper surface area and an array of microcircuit dies 204 disposed on the body 202. An epoxy resin 206 is provided to create insulation between adjacently disposed microcircuit dies 204 and encapsulate the body 202. In some embodiments, the array of microcircuit dies 204 substantially covers the upper surface area of the body 202 (e.g., leaving only relatively small spaces between adjacent dies and an outer peripheral area of the upper surface area uncovered). In some embodiments, one or more portions of the body 202 having the epoxy resin 206 exclude the microcircuit dies 204. For example, in some embodiments, areas along the periphery of the body 202 may include the epoxy resin 206 and exclude the microcircuit dies 204.

The thickness of the epoxy resin 206 may be between about 600 micrometers to 900 micrometers depending on the amount of tolerable warpage for the material composition of epoxy. In some embodiments, the epoxy resin 206 may have a glass transition temperature between about 140° C. and about 150° C. When provided, the substrate carrier 118 and the epoxy resin have a substantially similar coefficient of thermal expansion (CTE) (e.g., one CTE is no more than 10 percent different than the other CTE).

In some embodiments, the epoxy resin 206 may include a dopant 208. In some embodiments, for example as shown in FIG. 2, the dopant may be in the areas along the periphery of the body 202 including the epoxy resin 206, away from the array of microcircuit dies 204.

The dopant 208 enhances the fluorescence of the epoxy resin 206. Enhancing the fluorescence of the epoxy resin 206 in turn improves detection sensitivity of fluorescence light emitted by the epoxy resin 206 when radiated with an excitation light beam. In some embodiments, the epoxy resin 206 may be coated with the dopant 208, for example, the dopant 208 may be applied as a surface paint over the epoxy resin 206. Alternatively or in combination, the dopant 208 may be embedded in the epoxy resin 206, for example, the dopant 208 may be added during the synthesis of the epoxy resin 206.

The dopant 208 may be an organic or inorganic compound having a higher quantum yield relative to the epoxy resin 206 to ensure that the fluorescence of the epoxy resin 206 is enhanced. In some embodiments, the dopant 208 may comprise one or more temperature-sensitive fluorescent compounds selected from a list comprising polycyclic aromatic hydrocarbon compounds (PAHs), bis-byrene propane, benzoxazolyl stilbene (BOS), perylene, bis 2,5-tert-butylphenyl perylenedicarboximide (BTBP), 1-(4-dimethylaminophenyl)-6-phenyl-1,3,5-hexatriene (DMA-DPH), 9,10-diphenylanthracene (DPA), rhodamine, dichlorofluorescein, sulforhodamine B, 4,4'-diamino-2,2'-stilbenedisulfonic acid, 4 4'-bis(benzoxazolyl)-cis-stilbene and 2 5-bis(benzoxazol-2-yl) thiophene.

In some embodiments, the individual dies of the array of microcircuit dies 204 may be identical. In other embodiments, the individual dies of the array of microcircuit dies 204 may differ from each other. In some embodiments, the individual dies of the array of microcircuit dies 204 may be configured for use, for example, in memory, logic, communication, and sensing applications, although the microcircuit dies can be generally used in any application.

Figure 3:
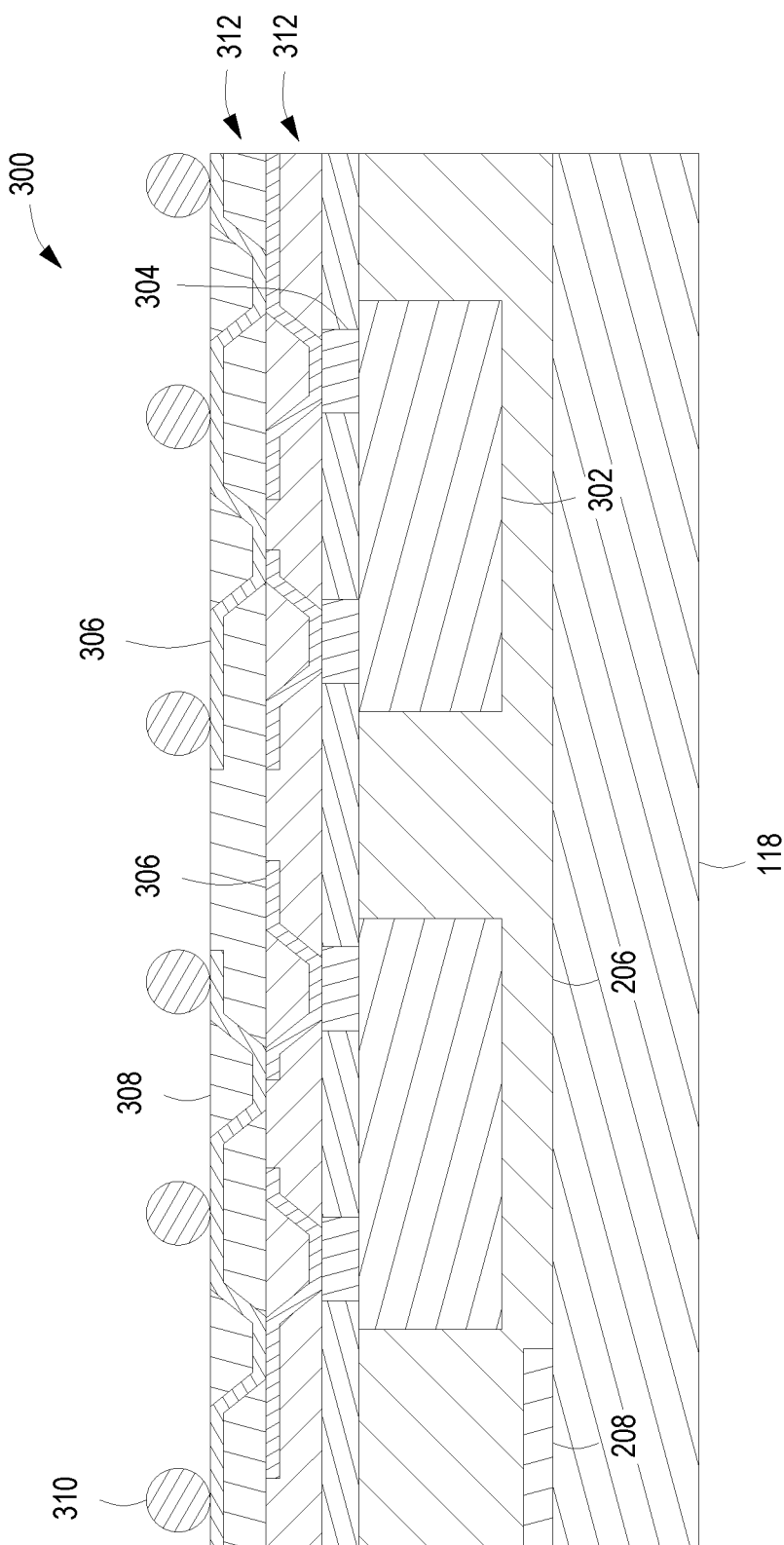
FIG. 3 depicts a schematic side view of an exemplary microcircuit die in accordance with one or more embodiments of the present disclosure.

FIG. 3 depicts an exemplary die 300 of the exemplary array of microcircuit dies 204. The die 300 includes one or more chips 302 having a bottom, a top, and sides between the top and the bottom. For example, the chip 302 may be a memory chip, a logic chip, a communication chip, or a sensor. In some embodiments, the bottom and sides of the chip 302 are embedded in the epoxy resin 206 such that the epoxy resin 206 provides insulation between the chips 302 of the same or another adjacently disposed die 300.

As shown in FIG. 3, each chip 302 includes one or more contact pads 304 formed on a side of the chip 302. The one or more contact pads 304 are coupled to a single one of one or more conductive traces 306 disposed in a redistribution layer (RDL) 312 (two RDLs 312 shown in FIG. 3). However, depending on the electronics application, in some embodiments the contact pads may be coupled to more than one of the conductive traces 306 disposed in the RDLs 312. In some embodiments, the contact pads 304 may be an input/output system for providing communication between an information system including the die 300 and another information processing system. The contact pads 304 are made of metal, for example, aluminum, copper, tungsten, or the like.

Each conductive trace 306 corresponding to each chip 302 is coupled to and extends from one or more locations of the chip 302 having the contact pads 304. For example, as shown in FIG. 3, each conductive trace 306 extends from two contact pads 304 of the respective chips 302. The conductive traces 306 are made of metal. The RDL 312 further includes a polymer layer 308 provided to substantially enclose the conductive trace 306. One or more portions of the conductive traces 306 across the top of the polymer layer 308 are exposed.

The exposed portions of the conductive traces 306 are provided for externally interconnecting the die 300 to other circuits and electronic components in an assembly including the die 300. In some embodiments, a solder bump 310 may be disposed on exposed portions of the conductive traces 306. The solder bumps 310 are provided to receive one or more external interconnect wires and form a permanent bond between the one or more external interconnect wires, the conductive traces 306 of the RDLs 312, and ultimately to the microcircuit dies 204.

In encapsulating the electronics package 116, the electronics package 116 undergoes one or more temperature-sensitive processes such as pre-cleaning, curing, and degassing. The inventors have discovered process results are improved by accurately and reliably measuring and controlling the temperature of the epoxy resin 206 in the substrate 114 of the electronics package 116.

To measure the temperature of the epoxy resin 206 of a substrate 114 of an electronics package 116, the light source 130 provides an excitation light beam to the epoxy resin 206 (and/or dopant 208, when present) on the underside of the substrate 114, as illustrated by directional arrow 172 in FIG. 1A. The excitation light beam leaving the light source 130 is carried by the first light carrier 150 and directed to the first optics arrangement 148. The first optics arrangement 148 focuses the excitation light beam into the first receiving end 138 of the first optical conduit 136. The excitation light beam propagates the length of the first optical conduit 136 and exits through the first delivery end 140. The excitation light strikes the epoxy resin 206 (and/or dopant 208, when present).

Upon excitation, the epoxy resin 206 (and/or dopant 208, when present) produces an emission light beam comprising fluorescence and reflectance light components. The emission light beam is directed to the second receiving end 144 of the second optical conduit 142, as illustrated by direction arrow 173 in FIG. 1A. The second optics arrangement 152 focuses the emission light into the second receiving end 144. The emission light propagates in the second optical conduit 142 and exits through the second delivery end 146 into the filtering element 154.

The filtering element 154 blocks the reflectance component and allows the fluorescence component of the emission light. The fluorescence light is carried by the second light carrier 158 and directed to the third optics arrangement 156. The third optics arrangement 156 focuses the fluorescence light into the signal analyzer 134.

The signal analyzer 134 measures the emission energy, a wavelength, and an intensity of the fluorescent light to reconstruct a light energy spectrum of the fluorescence light. The signal analyzer 134 compares the light energy spectrum of the fluorescence light to the light energy spectrum of the excitation light and performs a standard calculation to determine the temperature of the epoxy resin 206.

Figure 4:
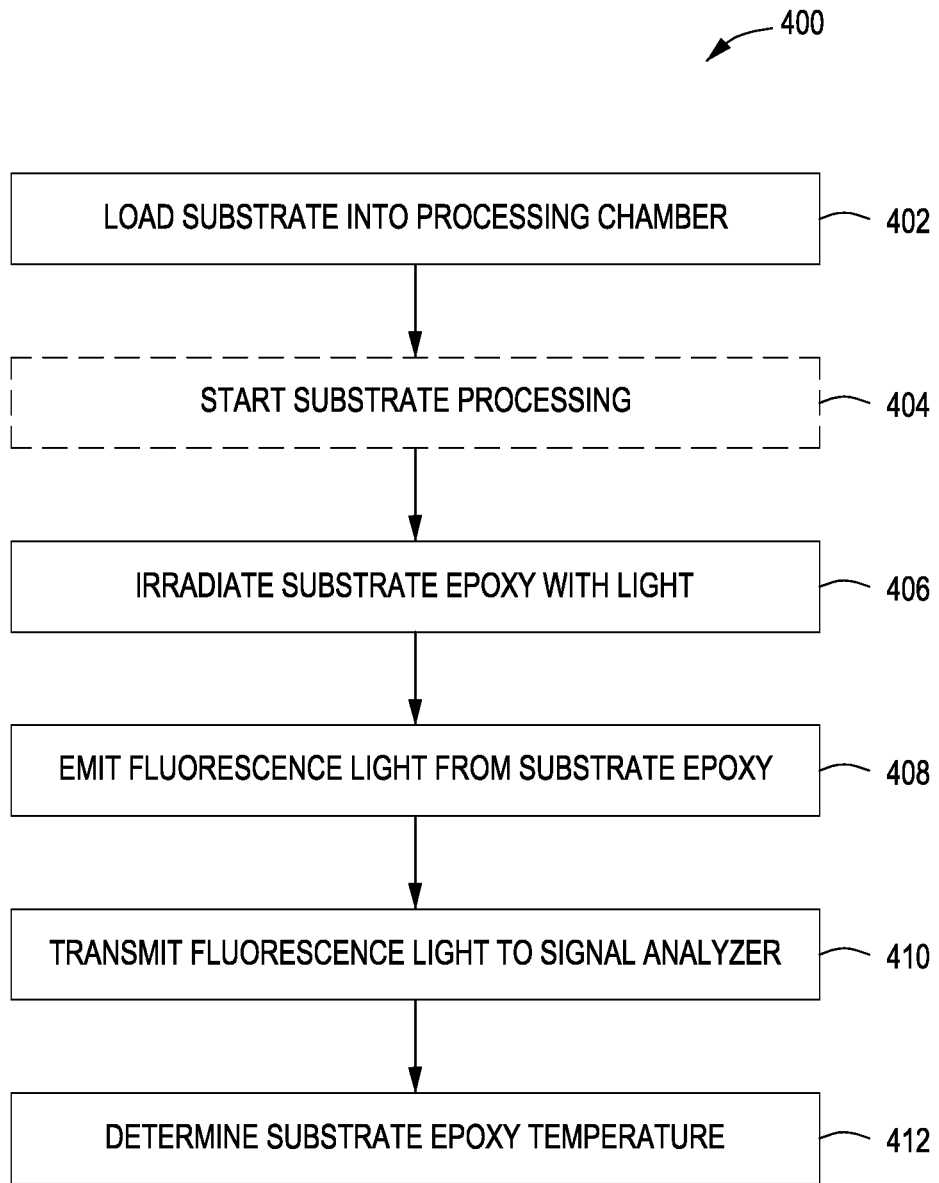
FIG. 4 depicts a method of measuring a temperature of an epoxy resin in a substrate for forming an electronics package in accordance with some embodiments of the present disclosure.

FIG. 4 depicts a flow chart for a method 400 of measuring a temperature of the epoxy resin 206 in a substrate 114 of an electronics package 116 in accordance with some embodiments of the present disclosure. The method 400 is described below with respect to FIG. 1A. The method may advantageously provide accurate, robust, and real-time temperature measurement of one or more electronics packages disposed in a process chamber.

The method 400 begins at 402 by loading an electronics package into the process chamber and onto the substrate support. Optionally, as shown at 404, temperature-sensitive processing may be started in the process chamber 102. At 406, a portion of an epoxy resin 206 in an electronics package is irradiated with an excitation light beam. At 408, a fluorescent light beam is emitted from the portion of the epoxy resin 206. At 410, the fluorescent light beam is transmitted to the signal analyzer 134. At 412, a temperature of the epoxy resin 206 is determined from a spectral analysis of excitation and emitted fluorescent light beams.

In some embodiments, determining the temperature of the epoxy resin at 412 may include reference to a look-up table based on a system calibration optionally performed before beginning the method 400. For example, the system calibration may include repeating (a)-(d) for each epoxy resin selected from a group of epoxy resins to develop a temperature reference look-up table for the group of epoxy resins. Thus, at 412, the accuracy of the measurement can be verified by comparing the determined temperature to the reference temperature. Alternatively, in some embodiments, the calibration process may be performed ex-situ.

The method 400 is similarly used to measure the temperature of the epoxy resin 206 in each substrate of each electronics package in a batch of multiple electronics packages (e.g., substrates 114a, 114b, and 114c depicted in FIG. 1B) in accordance with some embodiments of the present disclosure.

Returning to FIGS. 1A and 1B, a controller 174 may be provided and coupled to various components of the process chamber 102 to control the operation of the process chamber 102. The controller 174 includes a central processing unit (CPU) 176, support circuits 178 and a memory or computer readable medium 180. The controller 174 may control the heat source 120 and/or temperature sensor 126 directly, or via computers (or controllers) associated with particular process chamber and/or support system components. The controller 174 may be any form of general-purpose computer processor that can be used in an industrial setting for controlling various chambers and sub-processors. The memory, or computer readable medium, 180 of the controller 174 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 178 are coupled to the CPU 176 for supporting the processor in a conventional manner. These circuits include cache, power supplies, clock circuits, input/output circuitry and subsystems, and the like. Inventive methods as described herein, such as the method for measuring a temperature of a substrate, may be stored in the memory 180 as software routine 182 that may be executed or invoked to control the operation of the heat source 120 and/or temperature sensor 126 in the manner described herein. The software routine may also be stored and/or executed by a second CPU (not shown) that is remotely located from the hardware being controlled by the CPU 176.

Thus, improved non-contact fluorescence based epoxy temperature measuring apparatus and methods have been provided herein. The substrate temperature measuring systems disclosed herein provide accurate, robust, and real-time temperature measurements during one or more temperature sensitive electronics manufacturing processes.

While the foregoing is directed to embodiments of the present disclosure, other and further embodiments of the disclosure may be devised without departing from the basic scope thereof.

The invention claimed is:

1. Apparatus for encapsulating an electronics package, comprising:
   a process chamber having a chamber body enclosing a processing volume, the chamber body including one or more windows configured to allow light energy to pass therethrough during operation;
   a substrate support having a support surface for receiving and supporting a substrate for forming an electronics package; and
   a temperature sensor configured to measure a temperature of an epoxy resin in an electronics package while the electronics package is being encapsulated within the processing volume, the temperature sensor including:
   an input apparatus including at least a light source disposed outside the chamber body to provide an excitation light energy to a portion of the epoxy resin disposed on an underside of the substrate; and
   an output apparatus including at least a signal analyzer disposed outside the chamber body to detect fluorescent light energy emitted by the portion of the epoxy resin disposed on the underside of the substrate and determine a temperature of the epoxy resin based on the excitation light energy and the fluorescent light energy.

2. The apparatus of claim 1, further comprising a heat source disposed about the chamber body or in the processing volume.

3. The apparatus of claim 1, wherein the one or more windows include a first window for ingress of the excitation light energy formed in the chamber body, and a second window for egress of the fluorescent light energy formed in the chamber body.

4. The apparatus of claim 3, wherein a first optics arrangement is disposed between the light source and the first window, and wherein a second optics arrangement is disposed between the second window and the signal analyzer.

5. The apparatus of claim 3, further comprising a first optical conduit disposed through the first window and a second optical conduit disposed through the second window, wherein the first optical conduit is coupled to the light source and configured to provide a pathway for the excitation light energy to the portion of the epoxy resin, and wherein the second optical conduit is coupled to the signal analyzer and configured to provide a pathway for the fluorescent light energy emitted by the portion of the epoxy resin.

6. The apparatus of claim 1, wherein the light source is an excimer laser.

7. The apparatus of claim 1, wherein the signal analyzer includes a fluorescence spectrophotometer.

8. The apparatus of claim 1, further comprising a substrate holder disposed about the substrate support, the substrate holder comprising:
   one or more vertical supports; and
   a plurality of vertically spaced apart peripheral members extending radially inward from the vertical supports and defining a plurality of vertically spaced apart substrate support positions.

9. The apparatus of claim 8, further comprising a plurality of temperature sensors, wherein different ones of the plurality of temperature sensors are positioned to sense a temperature of epoxy resin in an electronic package for substrates disposed in different ones of the plurality of substrate support positions.

10. The apparatus of claim 8, wherein the substrate holder further comprises a lift assembly to control the vertical position of the peripheral members.

11. A method for measuring a temperature of an epoxy resin in an electronics package, comprising:
   (a) providing an excitation light beam to a portion of an epoxy resin disposed on an underside of a substrate in which an electronics package is formed while the electronics package is being encapsulated within a processing volume of chamber in which the electronics package is disposed;
   (b) receiving a fluorescent light beam emitted from the portion of the epoxy resin disposed on the underside of the substrate;
   (c) measuring an emission energy, a wavelength, and an intensity of the fluorescent light beam; and
   (d) determining a temperature of the epoxy resin based on the excitation light beam and emitted fluorescent light beams.

12. The method of claim 11, further comprising repeating (a)-(d) for each epoxy resin selected from a group of epoxy resins to develop a temperature reference look-up table for the group of epoxy resins.

13. The method of claim 11, further comprising simultaneously measuring temperature of epoxy resin in multiple electronics packages.

14. The method of claim 11, wherein the wavelength of the excitation light beam is between about 360 nm and about 400 nm.

15. The apparatus of claim 1, wherein encapsulating the electronics package comprises temperature-sensitive processes including at least one of curing, pre-cleaning, or degassing.

16. The method of claim 11, wherein encapsulating the electronics package comprises temperature-sensitive processes including at least one of curing, pre-cleaning, or degassing.

* * * * *